(12) United States Patent
Yang

(10) Patent No.: US 10,665,979 B2
(45) Date of Patent: May 26, 2020

(54) INTERFACE, ELECTRONIC DEVICE AND TEST METHOD

(71) Applicants: BOE TECHNOLOGY GROUP CO., LTD., Beijing (CN); K-TRONICS (SUZHOU) TECHNOLOGY CO., LTD., Suzhou, Jiangsu (CN)

(72) Inventor: Cheng Yang, Beijing (CN)

(73) Assignees: BOE TECHNOLOGY GROUP CO., LTD., Beijing (CN); K-TRONICS (SUZHOU) TECHNOLOGY CO., LTD., Suzhou, Jiangsu (CN)

( * ) Notice: Subject to any disclaimer, the term of this patent is extended or adjusted under 35 U.S.C. 154(b) by 177 days.

(21) Appl. No.: 15/547,880

(22) PCT Filed: Feb. 8, 2017

(86) PCT No.: PCT/CN2017/073114
§ 371 (c)(1),
(2) Date: Aug. 1, 2017

(87) PCT Pub. No.: WO2017/193656
PCT Pub. Date: Nov. 16, 2017

(65) Prior Publication Data
US 2018/0233844 A1 Aug. 16, 2018

(30) Foreign Application Priority Data
May 9, 2016 (CN) .......................... 2016 1 0302692

(51) Int. Cl.
*G01R 31/08* (2020.01)
*H01R 13/46* (2006.01)
(Continued)

(52) U.S. Cl.
CPC .......... *H01R 13/465* (2013.01); *G01R 31/69* (2020.01); *H01R 24/28* (2013.01); *H01R 27/00* (2013.01);
(Continued)

(58) Field of Classification Search
CPC ...... H01R 13/465; H01R 13/14; H01R 13/70; H01R 13/86; H01R 13/641;
(Continued)

(56) References Cited

U.S. PATENT DOCUMENTS 6,256,881 B1 * 7/2001 Starkey ............... B29C 33/0083
29/856
9,281,637 B2 * 3/2016 Holliday .............. H01R 9/0518
(Continued)

FOREIGN PATENT DOCUMENTS

| CN | 101483286 | * | 7/2009 |
| CN | 101483286 A | | 7/2009 |

(Continued)

OTHER PUBLICATIONS

The First Chinese Office Action dated Jan. 24, 2018; Appln. No. 201610302692.4.
(Continued)

*Primary Examiner* — Thang X Le

(57) ABSTRACT

An interface, an electronic device and a test method, adapted to connect with at least two types of signal connectors to establish signal connection, the interface includes a connecting portion and a socket portion located at an end of the connecting portion; wherein the socket portion includes at least two types of portions of different identifiers respectively, and the identifiers respectively correspond to the signal connectors adapted to be plugged into the interface to establish signal connection.

20 Claims, 4 Drawing Sheets

(51) Int. Cl.
*H01R 24/28* (2011.01)
*G01R 31/69* (2020.01)
*H01R 27/00* (2006.01)
*H01R 101/00* (2006.01)
*G01R 31/67* (2020.01)

(52) U.S. Cl.
CPC .......... *G01R 31/67* (2020.01); *H01R 2101/00* (2013.01); *H01R 2201/18* (2013.01)

(58) Field of Classification Search
CPC ............ H01R 13/6691; H01R 13/6658; H01R 2201/18; H01R 24/28; H01R 27/00; G01R 31/041; G01R 31/045
See application file for complete search history.

(56) References Cited

U.S. PATENT DOCUMENTS

| | | | | |
|---|---|---|---|---|
| 2004/0185707 | A1* | 9/2004 | Holliday | H01R 9/0518 439/491 |
| 2006/0268481 | A1* | 11/2006 | Brown | H01R 29/00 361/58 |
| 2008/0097635 | A1* | 4/2008 | Naumann | B25B 23/14 700/95 |
| 2008/0100467 | A1* | 5/2008 | Downie | G02B 6/3895 340/686.2 |
| 2012/0194971 | A1* | 8/2012 | Marker | H05K 5/0004 361/679.01 |
| 2015/0087187 | A1* | 3/2015 | Kifedjian | H01R 13/665 439/620.22 |

FOREIGN PATENT DOCUMENTS

| | | |
|---|---|---|
| CN | 101751366 A | 6/2010 |
| CN | 203104675 U | 7/2013 |
| CN | 204190089 U | 3/2015 |
| CN | 106025737 A | 10/2016 |
| JP | 0652945 A | 2/1994 |
| JP | 2012-114741 A | 6/2012 |
| WO | 2005/107272 A1 | 11/2005 |

OTHER PUBLICATIONS

International Search Report and Written Opinon dated Apr. 28, 2017; PCT/CN2017/073114.

\* cited by examiner

INTERFACE, ELECTRONIC DEVICE AND TEST METHOD

TECHNICAL FIELD

Embodiments of the present disclosure relate to an interface, an electronic device and a test method.

BACKGROUND

With development of technology, there have been more and more electronic devices, such as computers, televisions, etc. Wired connection among these devices needs to be realized by interconnection of interfaces and various connecting wires; besides, due to reasons such as differentiation of protocols and the like adopted by the electronic devices, the number of types of the interfaces is increased day by day.

SUMMARY

An embodiment of the present disclosure provides an interface, adapted to connect with at least two types of signal connectors to establish signal connection, the interface comprising a connecting portion and a socket portion located at an end of the connecting portion; wherein the socket portion includes at least two types of portions of different identifiers respectively, and the identifiers respectively correspond to the signal connectors adapted to be plugged into the interface to establish signal connection.

For example, in an interface provided by an embodiment of the present disclosure, the identifiers include colors.

For example, in an interface provided by an embodiment of the present disclosure, a total number of types of the identifiers of the socket portion is equal to a total number of types of the signal connectors adapted to be plugged into the interface to establish signal connection.

For example, in an interface provided by an embodiment of the present disclosure, a shape of the socket portion is circular or rectangular.

For example, in an interface provided by an embodiment of the present disclosure, the socket portion is made of an insulating material.

For example, in an interface provided by an embodiments of the present disclosure, the portions of the at least two types of identifiers of the socket portion are sequentially and uniformly distributed along a periphery of the socket portion section by section.

For example, in an interface provided by an embodiment of the present disclosure, wherein the portions of the at least two types of identifiers of the socket portion are sequentially distributed along a radial direction of the socket portion.

For example, in an interface provided by an embodiment of the present disclosure, the types of the signal connectors include a video signal connector and an audio signal connector.

For example, in an interface provided by an embodiment of the present disclosure, the types of the signal connectors include a Y interface in an YPbPr interface and a composite video baseband signal interface.

For example, in an interface provided by an embodiment of the present disclosure, the socket portion includes a green first portion and a yellow second portion.

For example, in an interface provided by an embodiment of the present disclosure, the first portion and the second portion are symmetrically distributed along a periphery of the socket portion.

For example, in an interface provided by an embodiment of the present disclosure, the first portion and the second portion are sequentially distributed along a radial direction of the socket portion.

An embodiment of the present disclosure provides an electronic device, including at least one interface described above.

For example, in an electronic device provided by an embodiment of the present disclosure, the electronic device further includes at least two types of signal connectors, wherein the at least two types of signal connectors respectively have identifiers corresponding to the portions of different identifiers that the interface comprises.

For example, in an electronic device provided by an embodiment of the present disclosure, the electronic device further includes in an electronic device provided by an embodiment of the present disclosure, the electronic device further includes an identifying module, wherein the identifying module is configured to: acquire a signal received by the connecting portion of the interface; and identify the type of the signal connector according to the acquired signal.

For example, in an electronic device provided by an embodiment of the present disclosure, the electronic device comprises a television or a set top box.

An embodiment of the present disclosure provides a test method for the interface described above, including: according to one of the different identifiers of the socket portion of the interface, plugging a signal connector corresponding to the one of the different identifiers.

For example, in a test method provided by an embodiment of the present disclosure, after plugging a signal connector corresponding to the one of the different identifiers, performances of the specific interface type corresponding to each identifier are tested.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
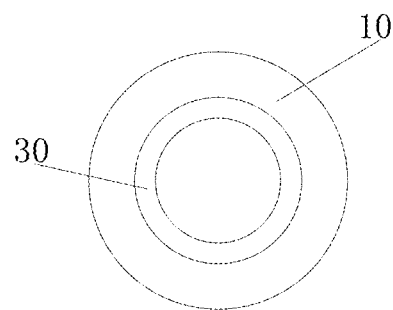
FIG. 1A is a front view of an interface provided by an embodiment of the present disclosure.

In order to make objects, technical details and advantages of the embodiments of the present invention apparent, the technical solutions of the embodiment will be described in a clearly and fully understandable way in connection with the drawings related to the embodiments of the present invention. It is obvious that the described embodiments are just a part but not all of the embodiments of the present invention. Based on the described embodiments herein, those skilled in the art can obtain other embodiment(s), without any inventive work, which should be within the scope of the present invention.

Unless otherwise specified, the technical terms or scientific terms here should be of general meanings as understood by those ordinarily skilled in the art. In the specification and claims of the present invention of the patent application, words such as "first", "second" and the like do not denote any order, quantity, or importance, but rather are used for distinguishing different components. Words such as "include" or "comprise" and the like denote that elements or objects appearing before the words of "include" or "comprise" cover the elements or the objects enumerated after the words of "include" or "comprise" or equivalents thereof, not exclusive of other elements or objects. "Connected" or "coupled" or similar words are not limited to physical or mechanical connection, and may comprise electrical connection, either direct or indirect connection. Words such as "up", "down", "left", "right", "horizontal", "vertical" and the like are only used for expressing relative positional relationship, when the absolute position of a described object is changed, the relative positional relationship may also be correspondingly changed.

The inventor notices in research that with the development of technology, the number of interfaces of electronic devices is becoming greater and greater, and therefore there is a demand to reduce the number of the interfaces disposed on the electronic devices and increase a recognition degree of a shared interface.

Embodiments of the present disclosure provide an interface, which is adapted to connect with at least two types of signal connectors to establish signal connection, and the interface includes a connecting portion and a socket portion located at an end of the connecting portion; the socket portion includes at least two types of portions of different identifiers respectively, and the identifiers respectively correspond to the signal connectors adapted to be plugged into such interface to establish signal connection. That is, the different identifiers of the socket portion can be respectively same as the identifiers of the signal connectors per se adapted to be plugged into such interface.

The interface according to the embodiments of the present discourse has obviously improved recognition degree, for example, misplugging can be effectively prevented in a use or test process. Comparatively speaking, if only one identifier (for example color) is labeled on the interface, or only characters are configured to mark the interface type on the interface, then the single color or character mark is difficult to differentiate, as a result, the electronic devices adopting these interfaces are very low in efficiency during an ex-factory test, and a case of wrong wire plugging very easily occurs.

In addition, according to the interface provided by the embodiment of the present disclosure, the socket portion can include at least two types of portions of different identifiers respectively, the identifiers respectively correspond to the signal connectors adapted to be plugged into such interface to establish signal connection, and therefore, a shared interface that can be connected with multiple signal connectors is provided, the number of the interfaces on the electronic devices is reduced, and user experience is further improved.

For example, in one embodiment of the present disclosure, the identifier includes color. Of course, other identifiers, such as simple icons or characters, can also be adopted, which is not limited by the embodiment of the present disclosure here.

For example, in the interface provided by an embodiment of the present disclosure, the socket portion includes two types of portions of different icons respectively; for example, the upper half portion of the socket portion has a triangular icon while the lower half portion has a circular icon, and the signal connector adapted to be plugged into such interface to establish signal connection has identifiers of a triangular icon or circular icon.

Different colors as the different identifiers are taken as examples for explanation specifically hereinafter.

For example, in the interface provided by an embodiment of the present disclosure, the socket portion includes at least two types of portions having different colors respectively, and the different colors respectively correspond to the signal connectors adapted to be plugged into such interface to establish signal connection.

Because obviously distinguishing colors are less, when multiple (for example, more than three) interfaces are distinguished by using one color respectively, the problems of wrong wire plugging and difficulty in identification of the shared interface are easily caused. The interface provided by the embodiment of the present disclosure enables the socket portion to include at least two types of portions having different colors respectively, such that in one aspect, a recognition degree of the shared interface can be increased, and in another aspect, the structure is simple and a manufacturing cost is lower.

For example, in an embodiment of the present disclosure, a total number of the types of the identifiers (for example, color) that the socket portion has equals to that of the type of the signal connectors adapted to be plugged into the interface to establish signal connection.

For example, in an embodiment of the present disclosure, the socket portion can be of a circular structure, and the device and interface adopting the circular socket portion contain but not limited to a video interface of a television, and the socket portion can also be of a rectangular structure, and the device and interface adopting the rectangular socket portion contain but not limited to a data transmission interface of a computer. Of course, the socket portion can also adopt other shapes, for example, trapezoid, triangle, and the like, which is not limited by the embodiment of the present disclosure.

Figure 1B:
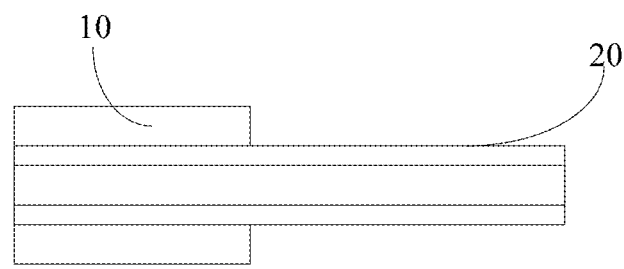
FIG. 1B is a section view of an interface provided by an embodiment of the present disclosure.

FIG. 1A and FIG. 1B are schematic diagrams of an interface 10 provided by an embodiment of the present disclosure, the interface for example is disposed on a plugging panel of the electronic device, FIG. 1A merely shows a main view of such interface, and FIG. 1B shows a lateral section view of such structure. The socket portion 30 of the interface 10 in the embodiment is circular. As shown in FIG.

1A and FIG. 1B, the interface 10 includes a connecting portion 20 and the socket portion 30 located at an end of the connecting portion 20. When such structure is applied in a use state of the electronic device, the socket portion 30 is a portion of the interface 10 that presents to a user (i.e., an outer portion), and various types of signal connectors corresponding to the interface 10 can be plugged into the socket portion 30 by the user and further realize signal transmission together with the connecting portion 20 in the socket portion 30. The connecting portion 20 is a portion that does not present to the user usually (i.e., an inner portion), and is configured to be connected to a circuit in the electronic device to transmit an electric signal.

For example, the socket portion 30 adopts an insulating material, which is generally plastic, rubber or the like.

For example, the interface 10 is adapted to be plugged by the signal connectors of multiple (for example two or more) connection types, the socket portion 30 of the interface 10 has portions with multiple (correspondingly two or more) colors, and the portions presenting these colors can be uniformly or non-uniformly arranged on the socket portion 30. For example, the socket portion 30 of the interface 10 can have for example portions with three or four colors.

For example, the portions of at least two colors of the socket portion 30 are sequentially and uniformly distributed along a periphery of the socket portion 30 section by section.

Figure 2A:
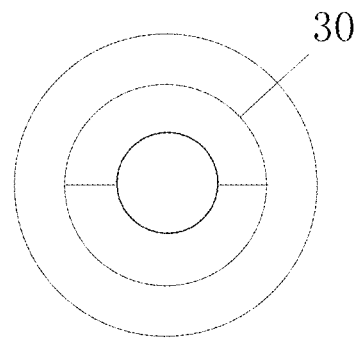
FIG. 2A is a schematic diagram that two portions of a circular socket portion are distributed along a periphery in an embodiment of the present disclosure.

FIG. 2A is a schematic diagram of an interface of another embodiment of the present disclosure, the circular socket portion 30 includes the portions of two different colors, which are uniformly or non-uniformly arranged on the socket portion 30 (only the uniform arrangement is shown in the drawing). As shown in FIG. 2A, the interface 10 can be configured to be connected to the signal connectors of two types A and B, and the two colors of the socket portion 30 respectively correspond to the signal connectors of the types A and B. For example, if the signal connector of the type A is red, and the signal connector of the type B is green, then half of the socket portion 30 presents red, and the other half presents green. For example, the upper half portion of the socket portion 30 presents green, and the lower half portion presents red. The drawing does not show specific color of each portion.

Figure 2B:
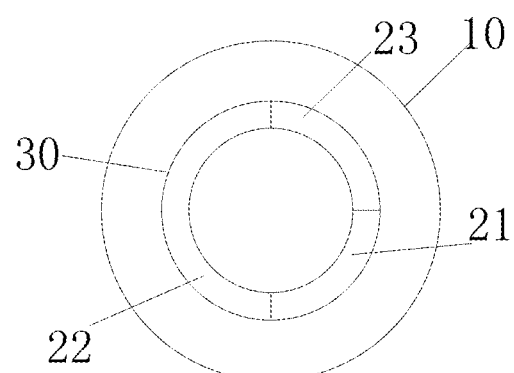
FIG. 2B is a schematic diagram that three portions of a circular socket portion are distributed along a periphery in an embodiment of the present disclosure.

FIG. 2B is a schematic diagram of an interface 10 of another embodiment of the present disclosure, the circular socket portion 30 includes the portions of three different colors, which are uniformly or non-uniformly arranged on the socket portion 30 (only the non-uniform arrangement is shown in the drawing) and are sequentially distributed on the periphery of the socket portion 30 section by section. As shown in FIG. 2B, the interface 10 can be adapted to be connected to the signal connectors of three types A, B and C, and the three colors of the socket portion 30 respectively correspond to the signal connectors of the types A, B and C. For example, if the signal connector of the type A is red, the signal connector of the type B is purple, and the signal connector of the type C is green, then a first portion 21 of the socket portion 30 presents red, a second portion 22 presents purple, and a third portion 23 presents green. The drawing does not show specific color of each portion.

Figure 2C:
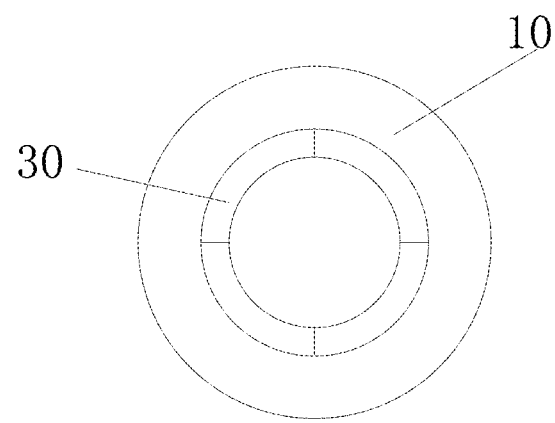
FIG. 2C is a schematic diagram that four portions of a circular socket portion are distributed along a periphery in an embodiment of the present disclosure.

FIG. 2C is a schematic diagram of an interface 10 of another embodiment of the present disclosure, the circular socket portion 30 includes the portions of four different colors, which are uniformly or non-uniformly arranged on the socket portion 30 (only the uniform arrangement is shown in the drawing) and are sequentially distributed on the periphery of the socket portion 30 section by section. As shown in FIG. 2C, the interface 10 can be adapted to be connected to the signal connectors of four types A, B, C and D, and the four colors of the socket portion 30 respectively correspond to the signal connectors of the types A, B, C and D. For example, if the signal connector of the type A is red, the signal connector of the type B is purple, the signal connector of the type C is yellow, and the signal connector of the type D is green, then a one quarter circumference of the socket portion 30 presents red, another one quarter circumference presents purple, another one quarter circumference presents yellow and the last one quarter circumference presents green. The drawing does not show specific color of each portion.

For example, the portions of at least two colors of the socket portion 30 can be sequentially distributed along a radial direction of the socket portion 30.

Figure 3A:
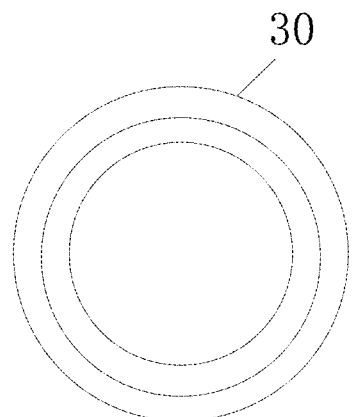
FIG. 3A is a schematic diagram that two portions of a circular socket portion are sequentially distributed along a radial direction in an embodiment of the present disclosure.

FIG. 3A is a local schematic diagram of an interface of another embodiment of the present disclosure, the circular socket portion 30 also includes the portions having two different colors, which are uniformly or non-uniformly arranged on the socket portion 30 (only the uniform arrangement is shown in the drawing), a difference from the embodiment as mentioned in FIG. 2A is that the portions of two different colors in the present embodiment are distributed along a radial direction instead of a circumferential direction of the socket portion. The interface 10 can be configured to be connected to the signal connectors of two types A and B, and the two colors of the socket portion 30 respectively correspond to the signal connectors of the types A and B. For example, if the signal connector of the type A is yellow, and the signal connector of the type B is blue, then one portion of the socket portion 30 presents yellow, and the other portion presents blue. For example, the inner circumference close to the inner side presents yellow, and the outer circumference close to the outer side presents blue. The drawing does not show specific color of each portion.

Figure 3B:
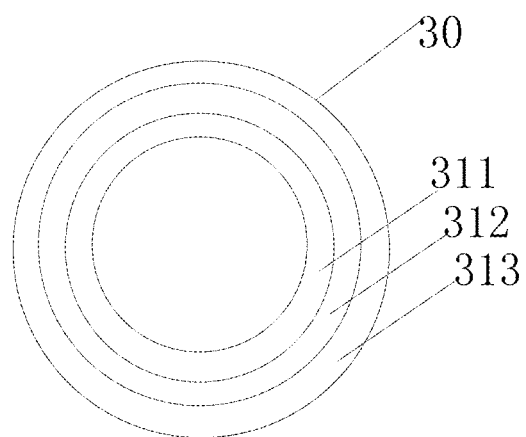
FIG. 3B is a schematic diagram that three portions of a circular socket portion are sequentially distributed along a radial direction in an embodiment of the present disclosure.

FIG. 3B is a partial schematic diagram of the socket portion 30 of another embodiment of the present disclosure, such circular socket portion 30 includes the portions of three different colors, which are uniformly or non-uniformly arranged on the socket portion 30 (only the uniform arrangement is shown in the drawing), and a difference from the embodiment as mentioned in FIG. 2B is that the portions of three different colors in the present embodiment are distributed along a radial direction instead of a circumferential direction of the socket portion 30. For example, the interface 10 can be configured to be connected to the signal connectors of three types A, B and C, and the three colors of the socket portion 30 respectively correspond to the signal connectors of the three types A. B and C. For example, if the signal connector of the type A is yellow, the signal connector of the type B is purple, and the signal connector of the type C is blue, then a first portion 311 of the socket portion 30 presents yellow, a second portion 312 presents purple and a third portion 313 presents blue. An arrangement sequence of the colors can be interchanged. The drawing does not show specific color of each portion.

Figure 3C:
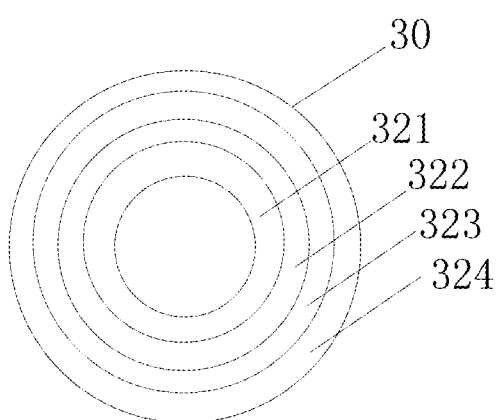
FIG. 3C is a schematic diagram that four portions of a circular socket portion are sequentially distributed along a radial direction in an embodiment of the present disclosure.

FIG. 3C is a partial schematic diagram of the socket portion 30 of another embodiment of the present disclosure, such circular socket portion 30 includes the portions of four different colors, which are uniformly or non-uniformly arranged on the socket portion 30 (only the uniform arrangement is shown in the drawing), and a difference from the embodiment as mentioned in FIG. 2C is that the portions of four different colors in the present embodiment are distributed along a radial direction instead of a circumferential direction of the socket portion 30. For example, the interface 10 can be configured to be connected to the signal connectors of four types A, B, C and D, and the four colors of the socket portion 30 respectively correspond to the signal connectors of the four types A, B, C and D. For example, if the signal connector of the type A is yellow, the signal connector of the type B is purple, the signal connector of the type C is green, and the signal connector of the type D is blue, then a first portion 321 of the socket portion 30 presents yellow, a second portion 322 presents purple, a third portion 323 presents green and a fourth portion 324 presents blue. An arrangement sequence of the colors can be interchanged. The drawing does not show specific color of each portion.

For example, in the embodiments of the present disclosure, the types of the signal connectors include a video signal connector and an audio signal connector. The types of the signal connectors can also be divided into a plurality of subtypes with regard to the video signal connector. The types of the signal connectors can also be divided into a plurality of subtypes with regard to the audio connector. The embodiments of the present disclosure are not limited to specific types of the signal connectors.

For example, in another embodiment of the present disclosure, the types of the multiple signal connectors include a Y interface in an YPbPr interface and a composite video baseband signal interface. When the respective signal connectors are the Y interface in the YPbPr interface and the composite video baseband signal interface, the socket portion 30 of a corresponding shared interface includes two portions, for example, a first portion presents green, and a second portion presents yellow. For example, the first portion and the second portion of the socket portion 30 are symmetrically distributed along the periphery of the socket portion 30. Or, the first portion and second portion of the socket portion are sequentially distributed along the radial direction of the socket portion 30.

For example, the upper half portion of the socket portion 30 is green (corresponding to the green Y interface in the YPbPr interface) and the lower half portion is yellow (corresponding to the yellow composite video baseband signal interface); or the upper half portion of the socket portion 30 is yellow (corresponding to the yellow composite video baseband signal interface) and the lower half portion is green (corresponding to the green Y interface in the YPbPr interface); or the left half portion of the socket portion 30 is green (corresponding to the green Y interface in the YPbPr interface) and the right half portion is yellow (corresponding to the yellow composite video baseband signal interface); or the left half portion of the socket portion 30 is yellow (corresponding to the yellow composite video baseband signal interface) and the right half portion is green (corresponding to the green Y interface in the YPbPr interface). However, the present embodiment is not limited to the manner mentioned above.

With rapid development of a liquid crystal television and advantages of the liquid crystal television per se, the liquid crystal television becomes mainstream of a flat television. The YPbPr interface and the Composite Video Baseband Signal (CVBS) interface are two types of most common interfaces; if the two can share one interface, then the shared interface can be effectively distinguished through the interface provided by the present embodiment, and therefore, the present embodiment can be applied to a production process of the liquid crystal television and the like, and an accuracy rate of wire plugging during performance test of the interface is effectively improved.

Besides, with the development of technology, more types of signal connectors connected to signal lines will share one interface (i.e., the interface of the embodiment of the present disclosure); at this point, new types of interfaces will still fail within a protection scope of the present disclosure as long as they adopt the structure of the embodiments recorded by the present disclosure. The embodiment of the present disclosure further provides an electronic device, comprising at least one interface according to the embodiment of the present disclosure. For example, the electronic device can further comprise at least two types of signal connectors, Which are matched with the structure mentioned above for use, and these at least two types of signal connectors respectively have colors corresponding to the portions of the interface with different colors.

For example, the electronic device can further include an identifying module configured to: acquire a signal received by the connecting portion of the interface; and identify the type of the signal connector according to the acquired signal. The identifying module can be realized by hardware, software, firmware or any combination thereof.

Figure 4:
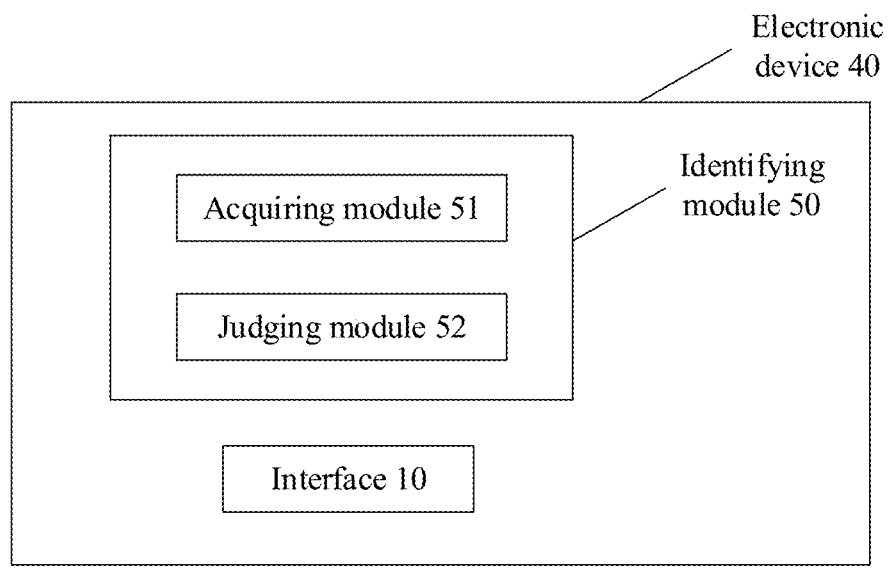
FIG. 4 is a structural schematic diagram of an electronic device provided by an embodiment of the present disclosure.

FIG. 4 is a block diagram showing the composition of the electronic device 40 according to an embodiment of the present disclosure. As shown in the drawing, the electronic device 40 comprises an interface 10 and an identifying module 50, which is configured to identify a type of the signal connector connected to the interface 10. For example, the identifying module 50 includes an acquiring module 51 and a judging module 52. The acquiring module 51 is configured to acquire a signal received by the connecting portion 20 of the interface 10; and the judging module 52 is configured to identify the type of the signal connector according to the signal acquired by the acquiring module 51.

Figure 5:
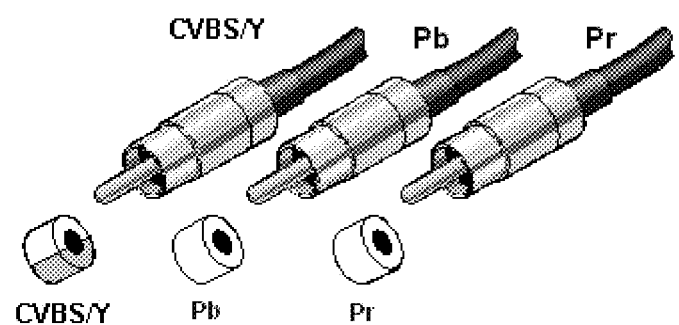
FIG. 5 is an interface schematic diagram of an electronic device provided by an embodiment of the present disclosure.

For example, in the embodiment as shown in FIG. 5, the Y interface in a YPbPr interface or a CVBS interface for an electronic device share the same interface, a Y signal connector and a CVBS connector can be plugged in such interface, while a Pb signal connector and a Pr signal connector in the YPbPr interface can be respectively plugged into a Pb interface and a Pr interface. In this case, if the identifying module 50 detects that only a brightness signal is transmitted on a connecting wire, then, the interface can be judged to be the Y interface, and if the identifying module 50 detects that the signals such as a height signal, a brightness signal, a synchronizing signal and the like are transmitted through the connecting wire, then the interface can be judged to be the CVBS interface, and further, specific performances of various connecting types can be further tested.

For example, the electronic device 40 according to the embodiment of the present disclosure can be a television, a monitor, a projector, a set top box or the like.

For example, in one embodiment of the present disclosure, an interface 10 of the electronic device 40 is configured to connect the Y interface in the YPbPr interface and a CVBS interface, and the socket portion 30 of the interface 10 has a green upper half portion and a yellow lower half portion.

During the ex-factory test of a television or set top box having the interface 10 with the yellow and green socket portion mentioned above, a tester can conveniently plug the yellow CVBS interface and the green Y interface in the YPbPr interface into such interface 10 for test, and a fault caused by plugging the yellow CVBS interface into the Pb interface or Pr interface by mistake is not easily caused. Therefore, the embodiments of the present disclosure can effectively improve test efficiency and provide fool-proofing.

Another embodiment of the present disclosure further provides a test method for an interface, which includes: according to one of the different colors that the socket portion of the interface has, plugging a signal connector having the one of the different colors.

For example, after the corresponding signal connector having one of the different colors is plugged, performances of the specific interface type corresponding to each identifier are tested.

For example, when the interface 10 is configured to connect with the Y interface in the YPbPr interface and the CVBS interface, an operator can select to plug into the green Y interface or yellow CVBS interface for corresponding test according to the yellow and green identifiers of the socket portion 30, which, at this point, can effectively overcome the defect of low measurement efficiency caused by plugging the CVBS interface into the Pb interface or Pr interface in the YPbPr interface by mistake.

For example, a test flow for the interface 10 in an ex-factory test process of a liquid crystal television having the embodiment of the present disclosure can be mentioned as follows.

Step 1: firstly plugging the Y interface in the YPbPr into the socket portion 30 of the interface 10 and performing performance test; and Step 2: then plugging the CVBS interface into the socket portion 30 for test performance.

Thus, it can be seen that in the embodiments of the present disclosure, by adopting the socket portion 30 with the yellow and green color identifiers, wrong plugging caused by plugging the CVBS connector into the Pb interface or Pr interface of the YPbPr can be better prevented.

The drawings of the embodiments of the present disclosure only involve the structures mentioned in the embodiments of the present disclosure, and other structures can refer to a general design. In a case of no conflict, the embodiments and features in the embodiments of the present disclosure can be inter-combined.

The foregoing embodiments merely are exemplary embodiments of the disclosure, and not intended to define the scope of the disclosure, and the scope of the disclosure is determined by the appended claims.

The application claims priority of Chinese Patent Application No. 201610302692A filed on May 9, 2016, the disclosure of which is incorporated herein by reference in its entirety as portion of the present application.

The invention claimed is:

1. An interface adapted to connect with at least two types of signal connectors to establish signal connection, the interface comprising a connecting portion and a socket portion located at an end of the connecting portion;
   wherein the socket portion includes at least two types of portions of different identifiers respectively, and the identifiers respectively correspond to the signal connectors adapted to be plugged into the interface to establish signal connection,
   wherein the portions of the at least two types of identifiers of the socket portion are sequentially and uniformly distributed along a periphery of the socket portion section by section.

2. The interface according to claim 1, wherein the identifiers include colors.

3. The interface according to claim 1, wherein a total number of types of the identifiers of the socket portion is equal to a total number of types of the signal connectors adapted to be plugged into the interface to establish signal connection.

4. The interface according to claim 1, wherein a shape of the socket portion is circular or rectangular.

5. The interface according to claim 1, wherein the socket portion is made of an insulating material.

6. The interface according to claim 1, wherein the types of the signal connectors include a video signal connector and an audio signal connector.

7. The interface according to claim 1, wherein the types of the signal connectors include a Y interface in an YPbPr interface and a composite video baseband signal interface.

8. The interface according to claim 1, wherein the socket portion includes a green first portion and a yellow second portion.

9. An electronic device, comprising at least one interface according to claim 1.

10. The electronic device according to claim 9, further comprising at least two types of signal connectors,
    wherein the at least two types of signal connectors respectively have identifiers corresponding to the portions of the interface with different identifiers.

11. The electronic device according to claim 9, further comprising: an identifying module,
    wherein the identifying module is configured to: acquire a signal received by the connecting portion of the interface; and identify the type of the signal connector according to the acquired signal.

12. The electronic device according to claim 9, wherein the electronic device comprises a television or a set top box.

13. A test method for the interface according to claim 1, comprising:
    according to one of the different identifiers of the socket portion of the interface, plugging a signal connector corresponding to the one of the different identifiers.

14. The test method according to claim 13, wherein after plugging a signal connector corresponding to the one of the different identifiers, performances of the specific interface type corresponding to each identifier are tested.

15. An interface adapted to connect with at least two types of signal connectors to establish signal connection, the interface comprising a connecting portion and a socket portion located at an end of the connecting portion;
    wherein the socket portion includes at least two types of portions of different identifiers respectively, and the identifiers respectively correspond to the signal connectors adapted to be plugged into the interface to establish signal connection,
    wherein the portions of the at least two types of identifiers of the socket portion are sequentially distributed along a radial direction of the socket portion.

16. The interface according to claim 15, wherein a total number of types of the identifiers of the socket portion is equal to a total number of types of the signal connectors adapted to be plugged into the interface to establish signal connection.

17. The interface according to claim 15, wherein a shape of the socket portion is circular or rectangular.

18. The interface according to claim 15, wherein the types of the signal connectors include a Y interface in an YPbPr interface and a composite video baseband signal interface.

19. An electronic device, comprising at least one interface according to claim 15.

20. A test method for the interface according to claim 15, comprising:
    according to one of the different identifiers of the socket portion of the interface, plugging a signal connector corresponding to the one of the different identifiers.

* * * * *